United States Patent [19]

Yamashita et al.

[11] 4,414,487

[45] Nov. 8, 1983

[54] SUPERCONDUCTING ELECTRON BEAM GENERATOR

[75] Inventors: Tsutomu Yamashita; Jinichi Matsuda, both of Nagaoka, Japan

[73] Assignee: Technological University of Nagaoka, Nagaoka, Japan

[21] Appl. No.: 311,238

[22] Filed: Oct. 14, 1981

[30] Foreign Application Priority Data

Dec. 29, 1980 [JP] Japan .............................. 55-187596

[51] Int. Cl.³ .......................................... H01J 23/065
[52] U.S. Cl. ...................................... 315/5; 313/336; 315/5.33
[58] Field of Search ............... 250/423 R, 423 F, 306, 250/310, 311; 313/336; 174/126 S; 315/5.33, 5

[56] References Cited

PUBLICATIONS

Zimmer, "Harmonic Generation of Microwaves Produced by a Field-Emission Cathode in a Superconducting Cavity", *Applied Physics Letters*, vol. 7, No. 11, Dec. (1965) pp. 297-298.

Dietrich et al., "A Proposal ... ", *Optik*, vol. 42, No. 5, Jun., 1975, pp. 439-462.

*Primary Examiner*—Alfred E. Smith
*Assistant Examiner*—Jack I. Berman
*Attorney, Agent, or Firm*—Spencer, Kaye & Frank

[57] ABSTRACT

A superconducting electron beam generator comprising a cavity resonator situated in a refrigerator and containing a superconductive metal member fixed on the cavity end plate, a tip of which member is disposed at the strongest point of a high frequency electric field formed in the cavity. A high quality and high energy coherent electron beam is emitted by the electric field from the tip of the metal member along an axis of the cavity and derived through a minute hole formed through the opposite end plate. This superconducting electron beam generator is particularly suitable for a high resolution electron microscope, a high quality X-ray generator, a crystallographic electron beam apparatus and the like.

4 Claims, 5 Drawing Figures

SUPERCONDUCTING ELECTRON BEAM GENERATOR

BACKGROUND OF THE INVENTION (1) Field of the Invention

The present invention relates to a superconducting electron beam generator for generating a high quality electron beam having a uniform energy level distribution, which beam is emitted by an intense electric field from a superconductor.

(2) Description of the Prior Art

Generally speaking, in a conventional electric field emission type electron beam generator, a dc high voltage only or a dc voltage together with an ac high voltage is applied to a normally conductive metal member, so that the required electron beam is emitted from the normally conductive metal member. However, in the conventional electron beam generator of the electric field emission type, which is operated at room temperature, electrons emitted from the metal member have energy levels which are distributed in a wide range, that is, the energy levels of those electrons are widely distributed, so that the coherency of the emitted electron beam is too poor to provide a sharp electron beam. Therefore, the performances of high resolution electron microscopes, electron gums used for high quality X-ray generators and the like, which employ these conventional electron beam generators, have definite limitations.

SUMMARY OF THE INVENTION

An object of the present invention is to remove the aforesaid shortcoming of the electron beam generator of the electric field emission type.

Another object of the present invention is to provide a super electron beam generator of a novel electric field emission type by which the aforesaid limit of the performances of the above mentioned electron beam apparatus can be removed.

A feature of the superconducting electron beam generator according to the present invention is that a cavity resonator containing a superconductive metal member fixed to an end plate of the cavity, a tip of which metal member is disposed at the most intense point of a high frequency electric field formed in the cavity and spaced apart from an outlet thereof for the electron beam, is maintained in a state of superconduction, a high quality and high energy coherent electron beam being emitted from the tip of the superconductive metal member.

BRIEF DESCRIPTION OF THE DRAWINGS

For a better understanding of the invention, reference is made to the accompanying drawings, in which.

Throughout the various views of the drawings, 1 is a negative electrode metal plate, 2 is a positive electrode metal plate, 3 is a minute hole, 4 is a dc power source, 5 is a protective resistor, 6 is a protrusion serving as an electron beam emitting source, 7 is a cavity resonator, 8 is a superconductive metal piece, 9 is an electron beam projecting hole and 10 is a feeder conductor.

DESCRIPTION OF THE PREFERRED EMBODIMENTS

Figure 1:
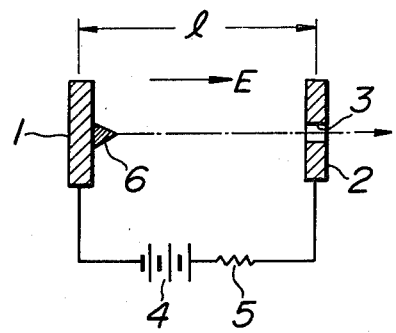
FIG. 1 is a schematic circuit diagram showing a conventional electric field emission type electron beam generator.

First, the structure of a conventional electric field emission type electron beam generator used for an electron microscope and similar apparatus is schematically shown in FIG. 1. In this generator, a negative electrode metal plate 1 consists of a normally conductive metal member which is employed as an electron beam emitting source, and a positive electrode metal plate 2 consists of a metal member which is disposed opposite to the negative electrode metal plate 1 separated therefrom by a distance l and provided with a minute hole 3 therethrough. A dc high voltage V is applied between electrode metal plates 1 and 2 by a dc power source 4 which is connected therebetween through a protective resistor 5. The electric field intensity E at the tip of a protrusion 6, which serves as an electron beam emitting source provided on a central portion of the negative electrode metal plate 1 is equal to $10^7$ V/cm. As a result, an electron beam is emitted from the tip of the protrusion 6 maintained at room temperature by the dc electric field formed between electrode metal plates 1 and 2 and then derived through the minute hole 3 of the positive electrode metal plate 2.

However, in this conventional electric field emission type electron beam generator, the range of energy level distribution occupied by the electrons comprising the above emitted electron beam depends principally on the temperature of the negative electrode metal plate 1 from which those electrons are emitted.

On the other hand, a physical quantity obtained at a temperature T is, in general, accompanied by a fluctuation thereof having an amount kT expressed by the dimension of energy. Accordingly, a fluctuation $\Delta V$ accompanying a voltage V of a battery situated, for instance, at room temperature is given by $\Delta V = kT/e$, where k is Boltzmann's constant, T is the absolute temperature and e is the electric charge of an electron, the absolute temperature T corresponding to the room temperature of about 300° K. Therefore, the range of energy level distribution occupied by the electrons emitted from the protrusion 6 disposed an the negative electrode metal plate 1, which serves as the electron beam emitting source, cannot be substantially less than the amount kT, and, as a result, the energy levels occupied by those electrons emitted at room temperature can be regarded as being distributed in a fairly wide range.

On the contrary, in the superconducting electron beam generator according to the present invention, an electron beam emitting source is maintained at an extremely low temperature, so as to be superconductive, and, as a result, the range of energy level distribution occupied by electrons comprising an electron beam emitted by an electric field, which depends on the temperature of the electron beam emitting source, can be made much narrower than that occupied at room temperature in a conventional electron beam generator, wherby a highly coherent and high quality electron beam can be realized.

Figure 2:
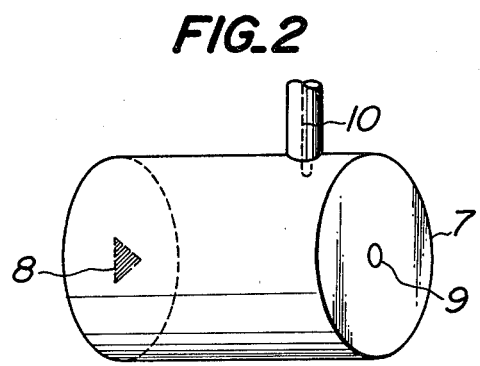
FIG. 2 is a schematic perspective view showing an embodiment of a superconducting electron beam generator according to the present invention.
Figure 3:
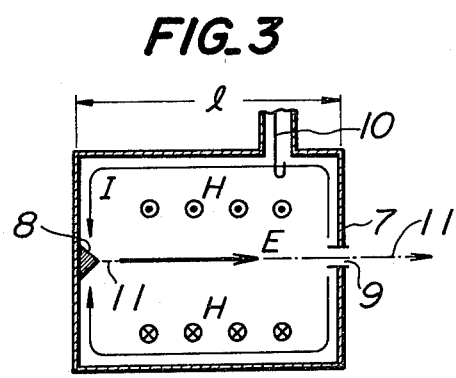
FIG. 3 is a cross sectional view of the embodiment shown in FIG. 2.
Figure 4:
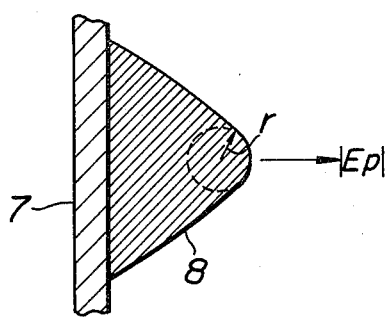
FIG. 4 is an enlarged cross sectional view showing a super conductive metal member contained in the embodiment shown in FIG. 3.

The appearance of an embodiment of the electric field emission type electron beam generator according to the present invention is shown in FIG. 2, and a sectional view thereof provided for clarifying its operation is shown in FIG. 3. In the embodiment shown in FIGS. 2 and 3, an electron beam emitting source is formed of a superconductive metal piece 8 consisting, for instance, of Pb, which is protruded in a form such as shown in FIG. 4 from an inner central portion of an end plate of a cylindrical cavity resonator 7 formed of a superconductive metal, for instance, Nb or Pb, a minute hole 9 for ejecting an electron beam from the cavity 7 is formed through another end plate thereof. Further, as shown in FIG. 3, a high frequency magnetic field H is formed in the circumferential direction of the cavity by a high frequency signal applied through a feeder conductor 10 which is coupled with the cavity 7 through a hole formed in a side wall thereof, and a high frequency electric field E is formed in the axial direction by the same signal.

The cavity resonator 7 constructed as mentioned above is made superconductive by placing it in a refrigerator (not shown), in which the temperature is kept at 4.2° K. by placing a refrigerating medium, for instance, liquid helium therein, and, as a result, a current I flows through the cavity wall in the direction shown in FIG. 3. The superconductive metal member 8, which serves as the electron beam emitting source, is situated at a point presenting the strongest intensity of the electric field E. The quality factor Q of the superconductive cavity resonator 7 situated as mentioned above can be increased to an extremely high value such as $Q \approx 10^{10}$, and the electric field E in this situation can be expressed by the following equation $$E \cong \sqrt{QP}$$

where P is the electric power fed to the cavity 7. Further, an electric field of intensity Ep applied to the tip of the super conductive metal member 8 situated as mentioned above can be expressed by the following equation $$Ep \approx E\, l/r$$

where l is the length of the cavity 7 as shown in FIG. 3 and r is the radius of curvature of the tip of the superconductive metal member 8 formed as shown in FIG. 4. Accordingly, when $Q=10^{10}$, $P=1$ W, the frequency of the applied high frequency signal is 10 GHz, $l=3$ cm and $r=10$ μm, the electric field intensity Ep becomes $$Ep \approx 10^8\ V/cm$$

As a result, it is possible to emit an electron beam from the tip of the superconductive metal member 8 situated as mentioned above, and further to accelerate the emitted electron beam by the strong electric field E formed in the superconductive cavity resonator 7 such as $E \approx \sqrt{QP} = 10^5$ V/cm, so that the high energy electron beam can be derived through the minute hole 9 provided for projecting it through the opposite end plate of the cavity 7. In respect to the range of energy level distribution of the electron beam which is emitted from the electric field emission type electron beam generator operated as mentioned above, on account of the effect of refrigeration which is attained by forming the superconductive cavity resonator of superconductive metals as well as by refrigerating the cavity at an extremely low temperature such as 4° K., the aforesaid fluctuation kT of the energy level distribution can be reduced to about one hundredth of that in the conventional electron beam generator operated at room temperature, namely, at about 300° K., and further the range of energy level distribution occupied by the electron beam, which is emitted from the source formed of the superconductive metal member 8, can be reduced to about one tenth as in the state of normal conduction, as discribed later by referring to FIGS. 5(A) and 5(B).

As a result, according to the mutually multiplicated effect between the aforesaid refrigeration effect and the aforesaid suprconduction effect, the energy level distribution of the electron beam obtained by the electron beam generator of the present invention can be greatly narrowed to about one thousandth of that obtained by the conventional electron beam generator operated at room temperature, whereby a high quality and high energy electron beam having a superior coherency based on a uniform energy level distribution can be realized.

Figure 5A:
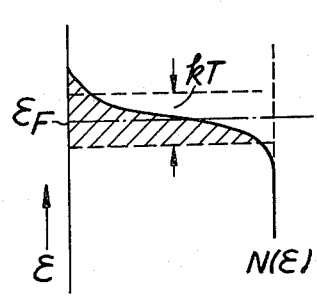
FIGS. 5(A) and 5(B) are diagrams showing examples of electron energy level distributions in a normally conductive metal and a superconductive metal respectively.

In connection therewith, FIG. 5(A) shows the state of energy level distribution near the Fermi energy level $\epsilon_F$ in the normal conductive metal by plotting energy levels E occupied by the electrons on the ordinate and plotting the state densities $N(\epsilon)$ of the electrons occupying the same energy levels $\epsilon$ on the abscissa. In this normal energy level distribution, electrons which contribute to the electron emission occupy energy levels distributed in the level range having the width kT near the Fermi energy level $\epsilon_F$ as shown by shading in FIG. 5(A).

Figure 5B:
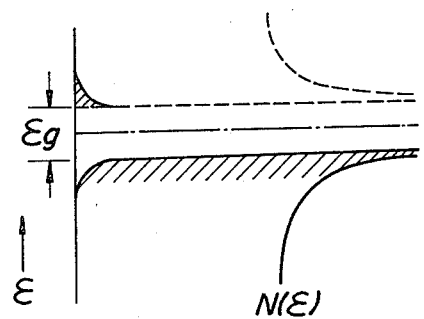

On the other hand, FIG. 5(B) shows by a diagram similar to FIG. 5(A) the state of the energy level distribution occupied by the electrons in the superconductive metal situated in the superconducting state. In this energy level distribution in the superconducting state, an energy gap $\epsilon_g$, which has a width substantially equal to kT, is formed near the Fermi energy level $\epsilon_F$, so that the electrons occupying the energy levels distributed in the level range which corresponds to the above energy gap $\epsilon_g$ in the normal conduction state, as shown in FIG. 5(A), are separately crowded near the upper end of the energy gap $\epsilon_g$ and near the lower end of the same respectively. As a result, the electrons which contribute to the electron emission occupy the energy levels distributed in a level range compressed to about one tenth of that of the aforesaid width kT, as shown by the shading in FIG. 5(B).

In connection therewith, between the above mentioned energy gap $\epsilon_g$ and the width kT of the fluctuation of the energy level occupied by electrons, the relation regarding the superconductive critical temperature, Tc, which is individually inherent in the superconductor, can be expressed by the following equation which is to be applied to a condition, for instance, at the temperature of absolute zero, according to the theory of superconductivity:

$$\epsilon_g\ (T=0) = 3.5\ kTc$$

The above equation indicates the state shown in FIG. 5(B).

As is apparent from the above explanation, according to the present invention, a high energy level electron beam which has an extremely narrow range of energy level distribution and hence a superior coherency can be emitted by supplying high frequency electric power which is much less than that required for a conventional electric field emission type electron beam generator, and further the emitted electron beam can be readily accelerated by the same intense electric field as is used for its emission. Accordingly, a superconducting electron beam generator of a novel electric field emission type, which provides a superior performance as mentioned above can be realized, which performance is suitable for application to a high resolution electron microscope, an electron gun used for a high quality X-ray generator, electronic crystallographic apparatus and the like.

What is claimed is:

1. A superconducting electron beam generator, comprising:

a cavity resonator having a hollow cylindrical portion, a first end plate secured to one end of said cylindrical portion and a second end plate secured to the other end of said cylindrical portion, said second end plate having an aperture in the central part thereof, an electric field being applied to said resonant cavity; and a metal member formed of a material having superconductive properties secured to said first end plate and projecting into said cavity, said superconductive metal member including a tip portion positioned opposite and spaced from said aperture by a distance on the order of the length of said cavity, the tip of said superconductive metal member being positioned within said cavity resonator in a region where said electric field has a maximum intensity and being maintained in a superconducting state, whereby a high energy electron beam is emitted from the tip of said superconductive metal member and passes through the aperture in said second end plate.

2. A superconducting electron beam generator as claimed in claim 1, wherein said superconductive metal member is maintained in a superconducting state by immersing said cavity resonator in a refrigerating medium.

3. A superconducting electron beam generator as claimed in claim 1, wherein said cavity resonator is provided with a feeder conductor in a surface thereof, said electric field being introduced into said cavity resonator through said feeder conductor.

4. A superconducting electron beam generator as claimed in claim 1, wherein said superconductive metal member is composed of one of Pb and Nb.

* * * * *